United States Patent
Yu et al.

(10) Patent No.: US 8,936,973 B1
(45) Date of Patent: Jan. 20, 2015

(54) ANODIZATION OF GATE WITH LASER VIAS AND CUTS

(71) Applicants: Gang Yu, Santa Barbara, CA (US); Chan-Long Shieh, Paradise Valley, AZ (US); Kaixia Yang, Shenzhen (CN)

(72) Inventors: Gang Yu, Santa Barbara, CA (US); Chan-Long Shieh, Paradise Valley, AZ (US); Kaixia Yang, Shenzhen (CN)

(73) Assignee: Cbrite Inc., Goleta, CA (US)

( * ) Notice: Subject to any disclaimer, the term of this patent is extended or adjusted under 35 U.S.C. 154(b) by 0 days.

(21) Appl. No.: 14/080,143

(22) Filed: Nov. 14, 2013

(51) Int. Cl.
  *H01L 21/00* (2006.01)
  *H01L 29/49* (2006.01)
  *H01L 29/66* (2006.01)

(52) U.S. Cl.
  CPC .......... *H01L 29/49* (2013.01); *H01L 29/66742* (2013.01)
  USPC ............................. 438/151; 438/104; 438/149

(58) Field of Classification Search
  USPC .......... 438/104, 149, 150, 151, 154, 155, 157
  See application file for complete search history.

(56) References Cited

U.S. PATENT DOCUMENTS

| | | | |
|---|---|---|---|
| 6,261,880 B1 * | 7/2001 | Wu | 438/159 |
| 6,403,408 B1 * | 6/2002 | Green et al. | 438/161 |
| 6,716,681 B2 * | 4/2004 | Wen et al. | 438/149 |
| 7,176,489 B2 * | 2/2007 | Ahn et al. | 257/59 |
| 8,273,600 B2 * | 9/2012 | Shieh et al. | 438/104 |
| 2012/0313092 A1 * | 12/2012 | Shieh et al. | 257/43 |
| 2013/0032796 A1 * | 2/2013 | Shieh et al. | 257/43 |

* cited by examiner

*Primary Examiner* — Kevin M Picardat
(74) *Attorney, Agent, or Firm* — Robert A. Parsons; Michael W. Goltry; Parsons & Goltry

(57) ABSTRACT

A method of forming a gate dielectric in each MOTFT of an active matrix includes depositing a layer of gate metal on a substrate and patterning the gate metal to define a matrix of MOTFTs each including a gate electrode with all gate electrodes in each column connected together by a gate metal line and the line in each column connected at one end to the line in the next adjacent column by a gate metal bridging portion. The gate metal is anodized to form a layer of gate dielectric material. A layer of semiconductor metal oxide is deposited over the anodized gate metal and patterned to define an active layer for each MOTFT. Source/drain electrodes are formed on the layer of metal oxide for each MOTFT, and a laser is used to cut the bridging portion electrically connecting each gate metal line to the next adjacent gate metal line.

18 Claims, 3 Drawing Sheets

ANODIZATION OF GATE WITH LASER VIAS AND CUTS

FIELD OF THE INVENTION

This invention generally relates to the formation of gate dielectric by anodizing the gate and the use of laser vias and cuts in the anodizing process.

BACKGROUND OF THE INVENTION

The anodization of metals into electrical insulators is a very attractive method of creating a gate dielectric for thin film transistors (TFT). Due to the self-limiting mechanism in the anodization process, the uniformity of thickness is guaranteed. Therefore, it is very easy to scale the anodization process to large substrates. The anodization process can be carried out in a typical ambience without the need for a vacuum and anodization solutions are inexpensive electrolytes. Further, the equipment cost and the operating cost of anodization is very low. While it is a challenge to make the anodized gate dielectric work for a-Si or Poly-Si due to their covalent natures, the process works very well for MOTFTs because of the ionic nature of metal oxide.

However, there are some disadvantages for anodized gate dielectrics. For example, in active matrix backpanels and the like to carry out the anodization process, all electrodes have to be connected together and to an external power supply. But in any large matrix design, the gate electrodes of different TFTs generally are isolated from each other. Therefore, a cut process is needed to provide the necessary isolation. When the cut process is performed, for example by photolithography, an extra mask and an extra etch step are introduced. These extra steps can substantially increase the complication and work in performing the anodization process. Also, vias are needed to connect the gate metal to subsequent metal layers to complete various circuits in the active matrix. Again, the formation of vias can substantially increase the complication and work in performing the connection process.

It would be highly advantageous, therefore, to remedy the foregoing and other deficiencies inherent in the prior art.

Accordingly, it is an object of the present invention to provide a new and improved process for anodizing gate metal in metal oxide thin film transistors (MOTFT) in large matrices to form the gate dielectric.

It is another object of the present invention to provide a new and improved process for fabricating an active matrix backpanel for LCD displays.

SUMMARY OF THE INVENTION

The desired objects of the instant invention are achieved in accordance with a method of forming a gate dielectric in each MOTFT of an active matrix. The method includes depositing a layer of gate metal on a substrate and patterning the gate metal to define a matrix of MOTFTs each including a gate electrode with all gate electrodes in each column connected together by a gate metal line and the line in each column connected at one end to the line in the next adjacent column by a gate metal bridging portion. The gate metal is anodized to form a layer of gate dielectric material. A layer of semiconductor metal oxide is deposited over the anodized gate metal and patterned to define an active layer for each MOTFT. Source/drain electrodes are formed on the layer of metal oxide for each MOTFT, and a laser is used to cut the bridging portion electrically connecting each gate metal line to the next adjacent gate metal line.

The desired objects of the instant invention are also achieved in accordance with a specific embodiment of a method of forming a gate dielectric in each MOTFT of an active matrix including the steps of providing a substrate, depositing a layer of gate metal on the substrate, and patterning the gate metal to define a matrix of MOTFTs aligned in rows and columns with each MOTFT including a gate electrode with all gate electrodes in each column connected together by a gate metal line and the gate metal line in each column connected at one end to the gate metal line in the next adjacent column by a gate metal bridging portion. The method further includes the step of anodizing the gate metal gate electrodes, the gate metal lines and the gate metal bridging portions, the anodizing forming a layer of gate dielectric material on the gate metal. A layer of semiconductor metal oxide is deposited over the patterned anodized gate metal and patterned to define an active layer for each MOTFT in the matrix of MOTFTs. A layer of etch-stop material is deposited on the layer of patterned semiconductor metal oxide and patterned to form a portion overlying the gate electrode and defining a channel area in each MOTFT in the matrix of MOTFTs. A layer of source/drain metal is deposited on the portions of etch-stop material defining the channel area and on surrounding semiconductor metal oxide in each MOTFT, and patterned to form source/drain metal electrodes for each MOTFT in the matrix of MOTFTs with the source/drain electrodes being spaced apart to partially cover the channel area in the active layer of each MOTFT. A laser is then used to cut the gate metal bridging portion electrically connecting each gate metal line to the next adjacent gate metal line.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which.

DETAILED DESCRIPTION OF THE DRAWINGS

Figure 1:
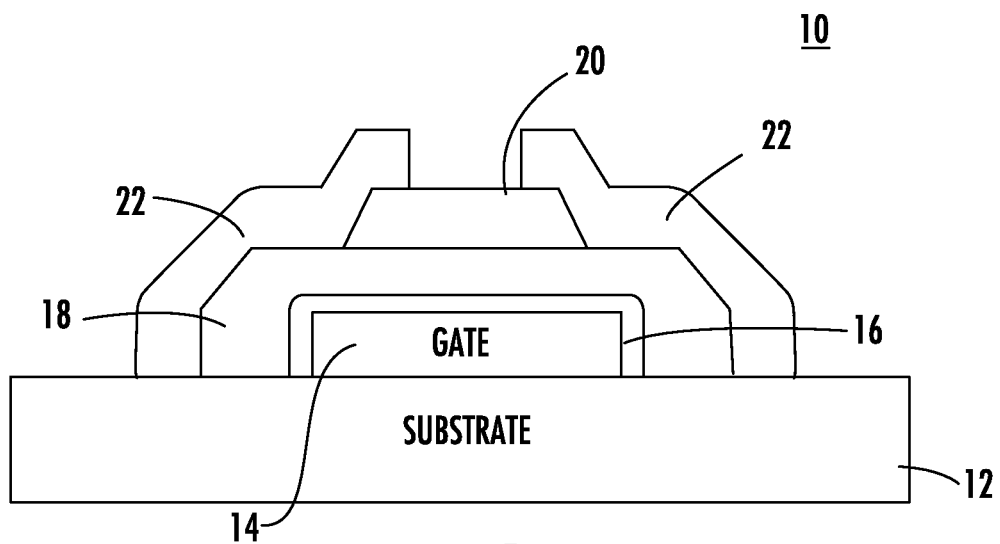
FIG. 1 illustrates a simplified layer diagram of a metal oxide thin film transistor (defined as an "etch-stop" MOTFT), in accordance with the present invention.

Turning to FIG. 1, a simplified layer diagram is illustrated of a metal oxide thin film transistor 10 (defined as an "etch-stop" MOTFT), in accordance with the present invention. MOTFT 10 includes a substrate 12, a gate 14 positioned on the substrate and gate dielectric 16 surrounding gate 14. A semiconductor metal oxide active layer 18 is deposited over gate dielectric 16 and the surrounding area. An etch-stop layer 20 is positioned on active layer 18 overlying gate 14 and defining a channel area in active layer 18. Source/drain metal deposited on active layer 18 and etch-stop layer 20 and is patterned to form source and drain contacts 22. A typical TFT of this type and methods of manufacture are disclosed in U.S. Pat. No. 7,977,151, incorporated herein by reference.

A typical process flow for an "etch-stop" MOTFT such as MOTFT 10 is to deposit gate metal and pattern the metal into gate 14 and metal interconnections for each TFT in the matrix. This requires a first mask but does not include critical alignment. During the patterning, all of the gates in the matrix are connected together and the anodization process is performed. Semiconductor metal oxide is then deposited in a blanket layer and patterned with a second mask. An etch-stop layer is deposited and patterned with a third mask. Source/drain metal is deposited and patterned with a fourth mask to form the spaced apart source and drain contacts and the required interconnections.

Figure 2:
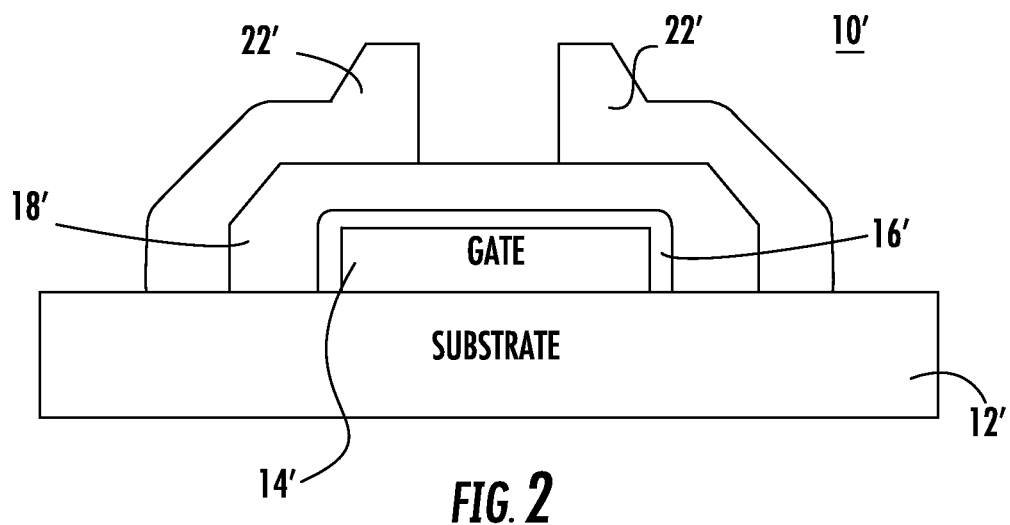
FIG. 2 illustrates a simplified layer diagram of a metal oxide thin film transistor (defined as a "back-channel etch" MOTFT), in accordance with the present invention.

Turning to FIG. 2, a simplified layer diagram is illustrated of a metal oxide thin film transistor 10' (defined as a "back-channel etch" MOTFT), in accordance with the present invention. MOTFT 10' includes a substrate 12', a gate 14' positioned on the substrate and gate dielectric 16' surrounding gate 14'. A semiconductor metal oxide active layer 18' is deposited over gate dielectric 16' and the surrounding area. Source/drain metal is deposited on active layer 18' and patterned to form source and drain contacts 22' spaced apart to define a channel area in active layer 18'.

A typical process flow for a "back-channel etch" MOTFT such as MOTFT 10' is to deposit gate metal and pattern the metal into gate 14' and metal interconnections for each TFT in the matrix. This requires a first mask but does not include critical alignment. During the patterning, all of the gates in the matrix are connected together and the anodization process is performed. Here it should be noted that the preferred gate metal for the anodization process is aluminum. Anodic aluminum oxide has a high dielectric constant (>7) and a very low leakage current making it ideal for the gate dielectric. Semiconductor metal oxide is then deposited in a blanket layer and patterned with a second mask. Source/drain metal is deposited and patterned with a third mask to form the spaced apart source and drain contacts 22' for each TFT in the matrix and the required interconnections.

Figure 3:
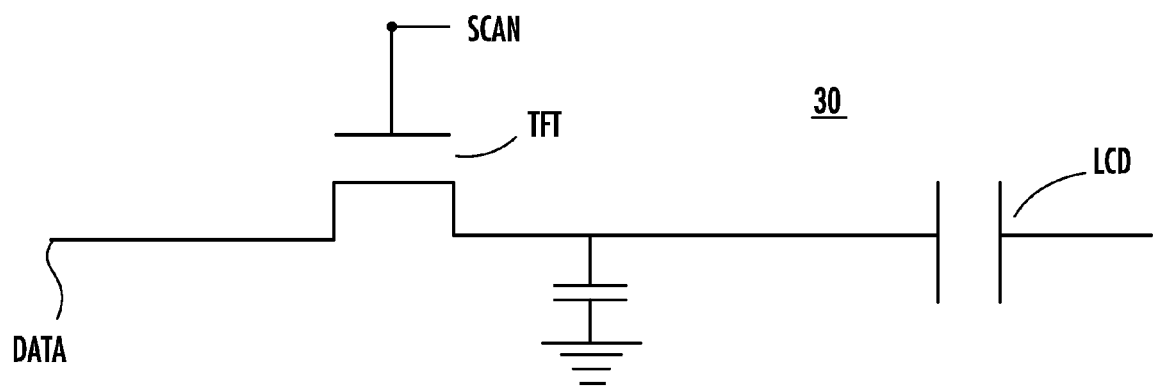
FIG. 3 is a schematic representation of a single LCD element in an active matrix liquid crystal display (AMLCD)

Referring specifically to FIG. 3, a schematic diagram of a typical single element 30 in a voltage driven AMLCD is illustrated. Single element 30 includes an LCD, a storage capacitor and a thin film transistor (TFT) driver. The TFT is activated or controlled by a scan line connected to the gate and a data line connected to the source/drain (S/D) terminals. While other variations of an AMLCD element may be available, all variations generally require separate scan lines and data lines. In addition to being used for AMLCD, the pixel driving circuit shown in FIG. 3 can also be used for driving EPD and for pixel readout in a 2D image array.

Figure 4:
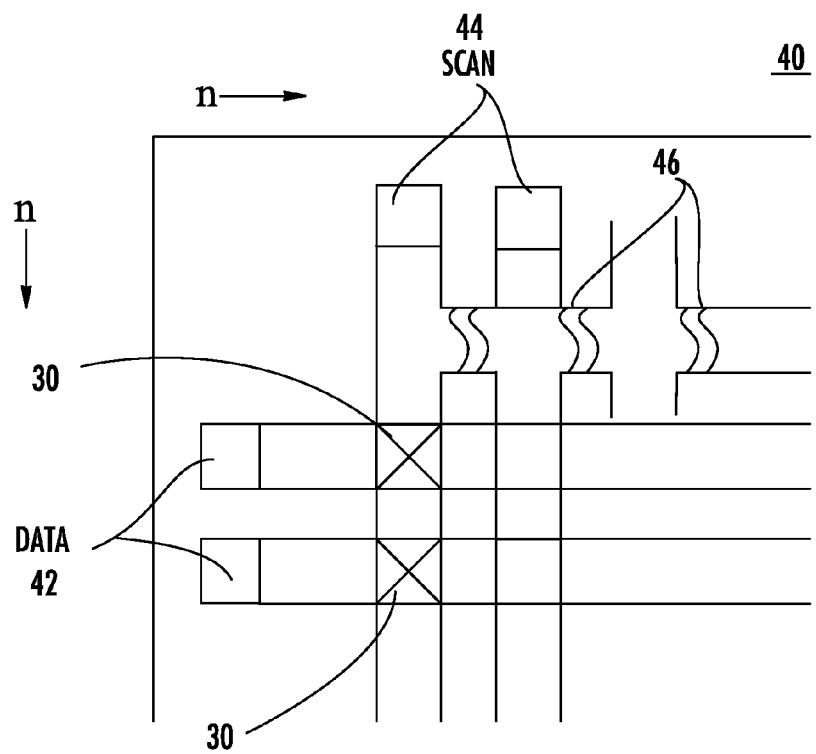
FIG. 4 is a partial plan view of an active matrix backpanel for a liquid crystal display, illustrating cuts in the gate metal and vias between the gate metal and subsequent metal layers.
Figure 5:
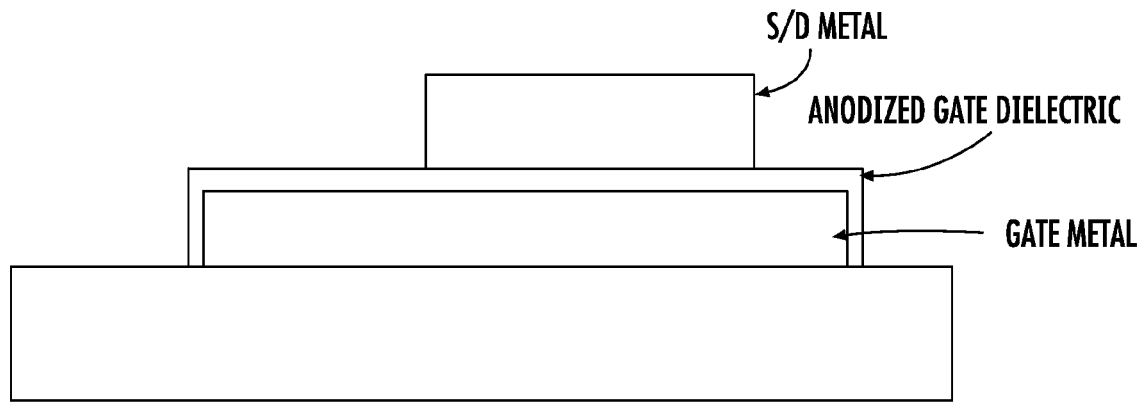
FIG. 5 is a simplified layer diagram illustrating the laser formation of vias between the gate metal and subsequent metal layers.

Turning to FIG. 4 a partial plan view of an active matrix backpanel 40 is illustrated. Backpanel 40 is used in various electronic devices, such as for a liquid crystal display. Backpanel 40 includes n data pads/lines 42 spaced vertically and extending horizontally across backplane 40 and n scan pads/lines 44 spaced horizontally and extending vertically across backplane 40. While data lines 42 and scan lines 44 are illustrated and described as extending horizontally and vertically, respectively, it should be understood that the lines could be exchanged, i.e. the data lines extending vertically and the scan lines extending horizontally. Also, while the data lines and scan lines are described as being an equal number, it will be understood that in many displays the number of data lines and the number of scan lines may differ, i.e. a rectangularly shaped display rather than square. It will be understood that at each intersection of a data line 42 and a scan line 44 a pixel is defined by, for example, an element 30. In a typical example, backplane 40 can include 1000 data lines 42 and 1000 scan lines 44 for a total of one million pixels.

As explained above, to perform an anodization process on the TFT gate electrode at each pixel all of the gate electrodes must be electrically connected together so that an external power supply can be attached. However, since all of the gate electrodes in each vertical line (1 through n) are attached to the scan line 44 in that line, all of the gate electrodes can be easily attached together adjacent the upper periphery by forming bridging metal portions 46 between adjacent scan lines 44 during the step of patterning the gate metal. In this example the gate electrodes of different TFTs are isolated from each other by cutting each bridging metal portion 46. Also, in this example there are only n bridging metal portions 46 that need to be cut, rather than one million (n×n) when each gate electrode must be separated from adjacent gate electrodes.

In this example, the n cuts that must be made to isolate the gate electrodes are most easily and efficiently made with a laser than by incorporating in a photolithography process using one or more extra masks and extra etch steps. Preferably the laser cuts are performed after the source/drain patterning steps in either of the above described processes. By adjusting the laser power to a relatively high level, the patterned gate metal in each bridging metal portion 46 can be blasted away to create the desired cut.

Vias needed to connect the gate metal to subsequent metal layers to complete various circuits in the active matrix are needed only for peripheral connections (e.g. generally n vias in this example) and are not needed inside the active matrix. Thus, vias between the gate metal layer and the source/drain metal layer can again be made most easily and efficiently by using a laser. Two different occasions during each of the above described MOTFT fabrication processes are convenient for the via formation process.

Figure 6:
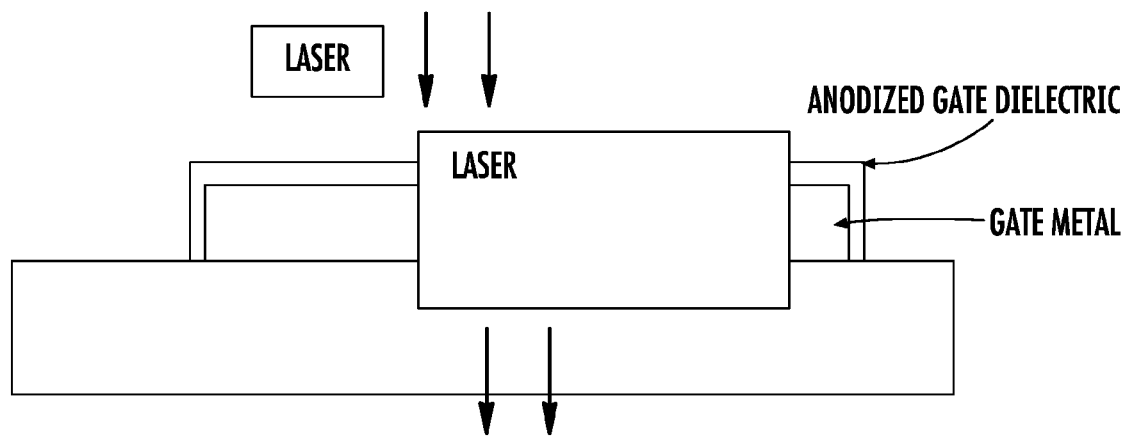
FIG. 6 is a simplified layer diagram illustrating laser cuts in the gate metal between TFTs.

The first occasion for the formation of vias is before the source/drain patterning step. To create a laser via, the laser is selectively illuminated on the anodized gate dielectric 16/16' so that the gate dielectric is cracked open by the partially melting gate metal, as illustrated in FIG. 6. The subsequent source/drain metal deposition makes a via connection between the gate metal and the source/drain metal at the area where the anodized gate dielectric is cracked open.

The second occasion for the formation of vias is after the source/drain metal patterning step. By selective laser illumination on a source/drain metal overlap of the gate metal in an area where a via is desired, the metals can be partially melted to crack the anodized gate dielectric and result in an electrical connection between the gate metal and the source/drain metal. In both of the above occasions the laser power is adjusted to a lower level than that used above for the cutting steps.

By using a laser for the cuts and vias as described above, the anodized gate dielectric MOTFT can be fabricated in four masks for the "etch-stop" MOTFT or three masks for the "back-channel etch" MOTFT. The laser cuts and vias described above are only linearly dependent on the size of the active matrix for voltage controlled active matrices such as the LCD backplane, which makes laser processing more effective and efficient than photolithography.

Thus, the present invention provides a new and improved process for fabricating an active matrix incorporating metal oxide thin film transistors (MOTFT). The process for fabricating the active matrix includes performing anodizing to form the gate dielectric and using a laser process for the formation of cuts to isolate the gate electrodes subsequent to anodizing and to form vias for interconnections between the gate metal and subsequent metal layers.

Various changes and modifications to the embodiment herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

1. A method of forming a gate dielectric in each MOTFT of an active matrix comprising the steps of:
   providing a substrate;
   depositing a layer of gate metal on the substrate;
   patterning the gate metal to define a matrix of MOTFTs aligned in rows and columns with each MOTFT including a gate electrode with all gate electrodes in each column connected together by a gate metal line and the gate metal line in each column connected at one end to the gate metal line in the next adjacent column by a gate metal bridging portion;
   anodizing the gate metal gate electrodes, the gate metal lines and the gate metal bridging portions, the anodizing forming a layer of gate dielectric material on the gate metal;
   depositing a layer of semiconductor metal oxide over the patterned anodized gate metal and patterning the layer of metal oxide to define an active layer for each MOTFT in the matrix of MOTFTs;
   forming source/drain metal electrodes on the layer of patterned semiconductor metal oxide for each MOTFT in the matrix of MOTFTs, the source/drain electrodes being spaced apart to partially cover a channel area defined in the active layer of each MOTFT; and
   using a laser, cutting the gate metal bridging portion electrically connecting each gate metal line to the next adjacent gate metal line.

2. The method as claimed in claim 1 further including steps of depositing and patterning a layer of etch-stop material on the patterned layer of metal oxide prior to the step of forming source/drain metal electrodes.

3. The method as claimed in claim 1 wherein the step of depositing a layer of gate metal includes depositing a metal including aluminum.

4. The method as claimed in claim 1 further includes a step of using a laser to form vias through the layer of gate dielectric material at selected positions adjacent a periphery of the active matrix.

5. The method as claimed in claim 4 wherein the step of using the laser to form vias is performed one of prior to the step of forming source/drain metal electrodes and subsequent to the step of forming source/drain metal electrodes.

6. The method as claimed in claim 5 wherein the step of using the laser to form vias prior to the step of forming source/drain metal electrodes the laser is illuminated at the selected position and partially melts the gate metal at the selected position to crack the layer of gate dielectric material and expose the gate metal.

7. The method as claimed in claim 5 wherein the step of using the laser to form vias subsequent to the step of forming source/drain metal electrodes the laser is illuminated at the selected position and partially melts the source drain metal and the underlying gate metal at the selected position to crack the layer of gate dielectric material therebetween and connect the source drain metal and the gate metal.

8. The method as claimed in claim 1 wherein the active matrix is a voltage controlled active matrix used in an LCD backplane.

9. A method of forming a gate dielectric in each MOTFT of an active matrix comprising the steps of:
   providing a substrate;
   depositing a layer of gate metal on the substrate;
   patterning the gate metal to define a matrix of MOTFTs aligned in rows and columns with each MOTFT including a gate electrode with all gate electrodes in each column connected together by a gate metal line and the gate metal line in each column connected at one end to the gate metal line in the next adjacent column by a gate metal bridging portion;
   anodizing the gate metal gate electrodes, the gate metal lines and the gate metal bridging portions, the anodizing forming a layer of gate dielectric material on the gate metal;
   depositing a layer of semiconductor metal oxide over the patterned anodized gate metal and patterning the layer of metal oxide to define an active layer for each MOTFT in the matrix of MOTFTs;
   depositing a layer of etch-stop material on the layer of patterned semiconductor metal oxide and patterning the etch-stop layer to form a portion overlying the gate electrode and defining a channel area in each MOTFT in the matrix of MOTFTs;
   depositing a layer of source/drain metal on the portions of etch-stop material defining the channel area and on surrounding semiconductor metal oxide in each MOTFT, and patterning the source/drain metal layer to form source/drain metal electrodes for each MOTFT in the matrix of MOTFTs, the source/drain electrodes being spaced apart to partially cover the channel area in the active layer of each MOTFT; and
   using a laser, cutting the gate metal bridging portion electrically connecting each gate metal line to the next adjacent gate metal line.

10. The method as claimed in claim 9 wherein the step of depositing a layer of gate metal includes depositing a metal including aluminum.

11. The method as claimed in claim 9 further includes a step of using a laser to form vias through the layer of gate dielectric material at selected positions adjacent a periphery of the active matrix.

12. The method as claimed in claim 11 wherein the step of using the laser to form vias is performed one of prior to the step of forming source/drain metal electrodes and subsequent to the step of forming source/drain metal electrodes.

13. The method as claimed in claim 12 wherein the step of using the laser to form vias prior to the step of forming source/drain metal electrodes the laser is illuminated at the selected position and partially melts the gate metal at the selected position to crack the layer of gate dielectric material and expose the gate metal.

14. The method as claimed in claim 12 wherein the step of using the laser to form vias subsequent to the step of forming source/drain metal electrodes the laser is illuminated at the selected position and partially melts the source drain metal and the underlying gate metal at the selected position to crack the layer of gate dielectric material therebetween and connect the source drain metal and the gate metal.

15. The method as claimed in claim 9 wherein the active matrix is a voltage controlled active matrix used in an LCD backplane.

16. A method of forming a gate dielectric in each MOTFT of a voltage controlled active matrix used in an LCD backplane, the method comprising the steps of:
  providing a substrate;
  depositing a layer of aluminum gate metal on the substrate;
  patterning the aluminum gate metal to define a matrix of MOTFTs aligned in rows and columns with each MOTFT including a gate electrode with all gate electrodes in each column connected together by a gate metal line and the gate metal line in each column connected at one end to the gate metal line in the next adjacent column by a gate metal bridging portion;
  anodizing the aluminum gate metal gate electrodes, the aluminum gate metal lines and the aluminum gate metal bridging portions, the anodizing forming a layer of aluminum oxide gate dielectric material on the aluminum gate metal;
  depositing a layer of semiconductor metal oxide over the patterned anodized aluminum gate metal and patterning the layer of metal oxide to define an active layer for each MOTFT in the matrix of MOTFTs;
  forming source/drain metal electrodes on the layer of patterned semiconductor metal oxide for each MOTFT in the matrix of MOTFTs, the source/drain electrodes being spaced apart to partially cover a channel area defined in the active layer of each MOTFT;
  using a laser, cutting the aluminum gate metal bridging portion electrically connecting each aluminum gate metal line to the next adjacent aluminum gate metal line; and
  using a laser, forming vias through the layer of gate aluminum oxide gate dielectric material at selected positions adjacent a periphery of the active matrix, the step of using the laser to form vias being performed one of prior to the step of forming source/drain metal electrodes and subsequent to the step of forming source/drain metal electrodes.

17. The method as claimed in claim 16 wherein the step of using the laser to form vias prior to the step of forming source/drain metal electrodes the laser is illuminated at the selected position and partially melts the gate metal at the selected position to crack the layer of gate dielectric material and expose the gate metal.

18. The method as claimed in claim 16 wherein the step of using the laser to form vias subsequent to the step of forming source/drain metal electrodes the laser is illuminated at the selected position and partially melts the source drain metal and the underlying gate metal at the selected position to crack the layer of gate dielectric material therebetween and connect the source drain metal and the gate metal.

* * * * *